US006756251B2

(12) United States Patent
Lee

(10) Patent No.: US 6,756,251 B2
(45) Date of Patent: Jun. 29, 2004

(54) METHOD OF MANUFACTURING MICROELECTRONIC DEVICES, INCLUDING METHODS OF UNDERFILLING MICROELECTRONIC COMPONENTS THROUGH AN UNDERFILL APERTURE

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,465

(22) Filed: Aug. 30, 2001

(65) Prior Publication Data

US 2003/0042617 A1 Mar. 6, 2003

(30) Foreign Application Priority Data

Aug. 21, 2001 (SG) .......................................... 200105099

(51) Int. Cl.[7] .......................... H01L 21/44; H01L 21/48; H01L 21/50; H01L 23/053; H01L 23/12; H01L 23/48; H01L 23/52; H01L 29/40; B23K 31/00; B23K 31/02; G03C 5/00

(52) U.S. Cl. ....................... 438/108; 438/127; 257/701; 257/778; 228/180.22; 430/311; 430/313; 430/317

(58) Field of Search ................................. 438/108, 127; 257/701, 778; 228/180.22; 430/311, 313, 317

(56) References Cited

U.S. PATENT DOCUMENTS

| 4,807,021 A | 2/1989 | Okumura |
| 5,347,159 A | 9/1994 | Khandros et al. |
| 5,366,794 A | 11/1994 | Nakao |
| 5,385,869 A | 1/1995 | Liu et al. |
| 5,386,341 A | 1/1995 | Olson et al. |
| 5,397,921 A | 3/1995 | Karnezos |
| 5,409,865 A | 4/1995 | Karnezos |
| 5,422,205 A * | 6/1995 | Inoue et al. .................... 430/5 |
| 5,448,511 A | 9/1995 | Paurus et al. |
| 5,646,446 A | 7/1997 | Nicewarner, Jr. et al. |
| 5,663,530 A | 9/1997 | Schueller et al. |
| 5,668,405 A | 9/1997 | Yamashita |
| 5,674,785 A | 10/1997 | Akram et al. |
| 5,697,148 A | 12/1997 | Lance, Jr. et al. |
| 5,710,071 A | 1/1998 | Beddingfield et al. |
| 5,719,449 A | 2/1998 | Strauss |
| 5,721,151 A | 2/1998 | Padmanabhan et al. |

(List continued on next page.)

FOREIGN PATENT DOCUMENTS

| DE | 19758197 A1 | 7/1999 | |
| JP | 2000-183082 | * 6/2000 | ........... H01L/21/56 |
| JP | 2001-077294 A | 3/2001 | |
| WO | WO 99/65282 A1 | 12/1999 | |

OTHER PUBLICATIONS

U.S. patent application Ser. No. 10/225,085, Lee et al., filed Aug. 20, 2002.

Isaak, H. and P. Uka, "Development of Flex Stackable Carriers," pp. 378–384, 50th IEEE Electronic Components and Technology Conference, 2000 Proceedings, Las Vegas, Nevada, May 21–24, 2000, IEEE, Inc., Jan. 2001.

Primary Examiner—Jack Chen
Assistant Examiner—Nema Berezny
(74) Attorney, Agent, or Firm—Perkins Coie LLP

(57) ABSTRACT

Supports (40) of microelectronic devices (10) are provided with underfill apertures (60) which facilitate filling underfill gaps (70) with underfill material (74). The underfill aperture may have a longer first dimension (62) and a shorter second dimension (64). In some embodiments, a method of filling the underfill gap (70) employs a removable stencil (80). If so desired, a stencil (80) can be used to fill multiple underfill gaps through multiple underfill apertures in a single pass.

43 Claims, 8 Drawing Sheets

U.S. PATENT DOCUMENTS

| | | |
|---|---|---|
| 5,739,585 A | 4/1998 | Akram et al. |
| 5,747,982 A | 5/1998 | Dromgoole et al. |
| 5,752,182 A | 5/1998 | Nakatsuka et al. |
| 5,758,413 A | 6/1998 | Chong et al. |
| 5,798,285 A | 8/1998 | Bentlage et al. |
| 5,805,422 A | 9/1998 | Otake et al. |
| 5,818,113 A | 10/1998 | Iseki et al. |
| 5,834,338 A | 11/1998 | Takeda et al. |
| 5,834,366 A | 11/1998 | Akram |
| 5,835,355 A | 11/1998 | Dordi |
| 5,843,808 A | 12/1998 | Karnezos |
| 5,844,168 A | 12/1998 | Schueller et al. |
| 5,866,953 A | 2/1999 | Akram et al. ............... 257/790 |
| 5,886,408 A | 3/1999 | Ohki et al. |
| 5,891,753 A | 4/1999 | Akram ...................... 438/108 |
| 5,898,224 A | 4/1999 | Akram ...................... 257/778 |
| 5,973,404 A | 10/1999 | Akram et al. |
| 5,977,640 A | 11/1999 | Bertin et al. |
| 5,982,030 A | 11/1999 | MacIntrye |
| 5,984,691 A | 11/1999 | Brodsky et al. |
| 5,991,161 A | 11/1999 | Samaras et al. |
| 6,008,543 A | 12/1999 | Iwabuchi |
| 6,011,694 A | 1/2000 | Hirakawa |
| 6,024,584 A | 2/2000 | Lemke et al. |
| 6,027,346 A | 2/2000 | Sinsheimer et al. |
| 6,028,365 A | 2/2000 | Akram et al. |
| 6,040,630 A | 3/2000 | Panchou et al. |
| 6,050,832 A | 4/2000 | Lee et al. |
| 6,057,178 A | 5/2000 | Galuschki et al. |
| 6,072,233 A | 6/2000 | Corisis et al. |
| 6,074,897 A * | 6/2000 | Degani et al. .............. 438/115 |
| 6,075,710 A | 6/2000 | Lau |
| 6,079,991 A | 6/2000 | Lemke et al. |
| 6,093,035 A | 7/2000 | Lemke et al. |
| 6,116,921 A | 9/2000 | Scholz et al. |
| 6,124,631 A | 9/2000 | Cardot et al. |
| 6,127,736 A | 10/2000 | Akram |
| 6,137,062 A | 10/2000 | Zimmerman |
| 6,137,164 A | 10/2000 | Yew et al. |
| 6,137,183 A | 10/2000 | Sako |
| 6,157,541 A | 12/2000 | Hacke |
| 6,165,885 A | 12/2000 | Gaynes et al. |
| 6,172,422 B1 | 1/2001 | Chigawa et al. |
| 6,179,598 B1 | 1/2001 | Brand |
| 6,208,521 B1 | 3/2001 | Nakatsuka |
| 6,212,768 B1 | 4/2001 | Murakami |
| 6,214,156 B1 | 4/2001 | Takano et al. |
| 6,218,202 B1 | 4/2001 | Yew et al. |
| 6,219,911 B1 | 4/2001 | Estes et al. |
| 6,221,763 B1 | 4/2001 | Gilton et al. |
| 6,225,688 B1 | 5/2001 | Kim et al. |
| 6,229,711 B1 | 5/2001 | Yoneda |
| 6,262,895 B1 | 7/2001 | Forthun |
| 6,291,775 B1 | 9/2001 | Saitoh |
| 6,294,455 B1 | 9/2001 | Ahn |
| 6,300,679 B1 | 10/2001 | Mukerji et al. |
| 6,310,288 B1 | 10/2001 | Moden ...................... 174/52.4 |
| 6,323,060 B1 | 11/2001 | Isaak |
| 6,413,102 B2 | 7/2002 | Jiang et al. |
| 6,429,516 B1 | 8/2002 | Tsunoi |
| 6,432,737 B1 * | 8/2002 | Webster ...................... 438/53 |
| 6,489,687 B1 | 12/2002 | Hashimoto |
| 6,492,737 B1 | 12/2002 | Imasu et al. |
| 6,518,677 B1 | 2/2003 | Capote et al. |
| 6,552,910 B1 | 4/2003 | Moon et al. |
| 2001/0167092 * | 7/2001 | Fee et al. .................. 257/778 |
| 2002/0164838 A1 | 11/2002 | Moon et al. |
| 2003/0164540 A1 | 9/2003 | Lee et al. |
| 2003/0164541 A1 | 9/2003 | Lee |
| 2003/0164543 A1 | 9/2003 | Lee |
| 2003/0164548 A1 | 9/2003 | Lee |
| 2003/0164551 A1 | 9/2003 | Lee et al. |
| 2003/0166312 A1 | 9/2003 | Lee |

* cited by examiner

METHOD OF MANUFACTURING MICROELECTRONIC DEVICES, INCLUDING METHODS OF UNDERFILLING MICROELECTRONIC COMPONENTS THROUGH AN UNDERFILL APERTURE

CROSS-REFERENCE TO RELATED APPLICATION

This application claims foreign priority benefits of Singapore Application No. 200105099-6 filed on Aug. 21, 2001.

TECHNICAL FIELD

This invention relates to microelectronic devices having microelectronic components mounted on substrates and methods of manufacturing such devices. The invention has particular utility in connection with flip-chip packaging.

BACKGROUND

Microelectronic devices, such as memory devices and microprocessors, typically include one or more microelectronic components attached to a substrate. The microelectronic components commonly include at least one die including functional features such as memory cells, processor circuits, and interconnecting circuitry. The dies of the microelectronic components may be encased in a plastic, ceramic or metal protective covering. Each die commonly includes an array of very small bond pads electrically coupled to the functional features. These terminals can be used to operatively connect the microelectronic component to the substrate.

One type of microelectronic component which is gaining increased acceptance is the "flip-chip" semiconductor device. These components are referred to as "flip-chips" because they are typically manufactured in wafer form having bond pads which are initially facing upwardly. After manufacture is completed and the semiconductor die is singulated from the wafer, it is inverted or "flipped" such that the surface bearing the bond pads faces downwardly for attachment to a substrate. The bond pads are usually coupled to terminals, such as conductive "bumps," which are used as electrical and mechanical connectors connecting the die to the substrate. A variety of materials may be used to form the bumps on the flip-chip, such as various types of solder and conductive polymers. In applications using solder bumps, the solder bumps are reflowed to form a solder joint between the flip-chip component and the substrate. This leaves a small gap between the flip-chip and the substrate. To enhance the joint integrity between the microelectronic component and the substrate, an underfill material is introduced into the gap between the components. This underfill material helps equalize stress placed on the components and protects the components from contaminants, such as moisture and chemicals.

The underfill material typically is dispensed into the underfill gap by injecting the underfill material along one or two sides of the flip-chip. As shown schematically in FIG. 1, a bead of an underfill material U may be dispensed along one side of the die D. The underfill material will then be drawn into the gap between the die D and the substrate S by capillary action. The direction of this movement is indicated by the arrows in FIG. 1. While such a "single stroke" process yields good results, the processing time necessary to permit the underfill material U to flow across the entire width of the die can reduce throughput of the manufacturing process.

FIG. 2 illustrates an alternative approach wherein the underfill material U is applied in an L-shaped bead which extends along two adjacent sides of the die D. By reducing the average distance which the underfill material has to flow to fill the underfill gap, processing times can be reduced. However, this L-stroke approach can lead to more voids in the underfill material, adversely affecting the integrity of the bond between the die D and the substrate S.

Typically, the underfill material U dispensed along the edge(s) of the die D in this process has a relatively high viscosity at dispensing temperatures. This permits a well-defined bead of material to be applied adjacent a single die D, facilitating a more dense arrangement of dies on the surface of the substrate. To get the underfill material U to flow into the underflow gap, the substrate is typically heated sufficiently to reduce the viscosity of the underfill material. This significantly increases manufacturing time and complexity.

Others have proposed pumping an underfill material into the underfill gap through an opening in the substrate. For example, U.S. Pat. No. 6,057,178 (Galuschki et al, the teachings of which are incorporated herein by reference) adds the underfill material via an orifice in the substrate. A viscous underfill material is added to the orifice (e.g., by dispensing it under pressure). The assembly must then be heated to allow the underfill material to flow into the underfill gap.

U.S. Pat. No. 5,697,148 (Lance Jr. et al., the teachings of which are incorporated herein by reference) also suggests dispensing an underfill material into the underfill gap through the substrate. The underfill material is injected under hydraulic pressure through an injection port using a needle. Injecting underfill material using a dispenser such as suggested in this patent and in the Galuschki et al. patent requires precise placement of the dispensing tip in the relatively small opening in the substrate. Fairly complex vision systems must be employed to ensure that the dispensing tip is properly aligned with the opening. Using a small dispenser also makes it more difficult to fill multiple underfill gaps between different die-substrate pairs at one time.

SUMMARY OF THE INVENTION

The present invention provides certain improvements in microelectronic devices and various aspects of their manufacture. In accordance with one embodiment, the invention provides a microelectronic device assembly which includes a microelectronic component and a first support. The microelectronic component has a facing surface, an exterior surface, and a first terminal array carried on the facing surface. The first support has a component surface, a mounting surface, a second terminal array, and an aperture which extends through the support from the component surface to the mounting surface. The second terminal array is carried on the component surface and is electrically coupled to the first terminal array of the microelectronic component. The aperture has a first dimension and a second dimension less than the first dimension. The component surface of the support is juxtaposed with the facing surface of the microelectronic component to define a first underfill gap between the component surface and the facing surface. A first underfill material at least substantially fills the first underfill gap.

In an alternative embodiment, the microelectronic device assembly further includes a second support such as a circuit board. In this embodiment, the first support includes a third terminal array on its mounting surface. A second support has a fourth terminal array carried on a terminal surface. The third terminal array of the first support is electrically coupled to the fourth terminal array of the second support. The mounting surface of the first support is juxtaposed with the terminal surface of the second support a define a second underfill gap therebetween. A second underfill material, which may be the same as the first underfill material, substantially fills the second underfill gap.

Another embodiment of the invention provides a method for underfilling a microelectronic component which is electrically coupled to a support to define an underfill gap, with an underfill aperture extending through the support and in fluid communication with the underfill gap. In accordance with this method, a stencil is placed adjacent the underfill aperture, the stencil having a stencil opening in registry with the underfill aperture. The stencil opening defines, at least in part, a fill volume at least as great as the volume of the underfill gap. The stencil opening is filled with a flowable underfill material which is permitted to flow through the support via the underfill aperture and substantially fill the first underfill gap. The stencil may be removed, leaving a completed, underfilled microelectronic device assembly.

Another embodiment of the invention provides a method of manufacturing a microelectronic device assembly including a support and a plurality of microelectronic components. Each of the microelectronic components may have a facing surface carrying a terminal array and the support may have a mounting surface, a component surface carrying a plurality of terminal arrays, and a plurality of underfill apertures. For each microelectronic component, a connecting material is deposited on the terminal array of the microelectronic component and/or an associated one of the terminal arrays of the support. The facing surface of each microelectronic component is juxtaposed with the component surface of the support such that the connecting material electrically couples the terminal array of the microelectronic component with the associated terminal array of the support. The facing surface of each microelectronic component is spaced from the component surface of the support to define a separate underfill gap between each microelectronic component and the support. At least one of the underfill apertures in the support is in fluid communication with each of the underfill gaps. A stencil is placed adjacent to the mounting surface of the support, with the stencil having a separate stencil aperture in registry with each of the underfill apertures in the support. Each stencil aperture defines, at least in part, a fill volume at least as great as the volume of the underfill gap in fluid communication with the underfill aperture with which the stencil aperture is registered. All of the stencil apertures are filled with a flowable underfill material, preferably in a single pass. The underfill material is permitted to flow through the support via the apertures and laterally outwardly therefrom to substantially fill each of the underfill gaps. The stencil may be removed, leaving the final microelectronic device assembly.

In accordance with still another embodiment, the invention provides a method of underfilling a microelectronic component which is electrically coupled to a support such that the microelectronic component and the support define an underfill gap therebetween. According to this method, an underfill aperture in the support is filled with an underfill material. The underfill aperture has a first dimension and second dimension less than the first dimension. The underfill material is allowed to flow outwardly from the underfill aperture to substantially fill the underfill gap. In one particular adaptation of this embodiment, the microelectronic component has a pair of spaced-apart lateral edges and a pair of spaced-apart transverse edges. The underfill aperture is spaced farther from each of the lateral edges than from either of the transverse edges. The underfill material flows outwardly from the underfill aperture a greater distance, and covers a greater surface area, in a lateral direction than in a transverse direction.

DETAILED DESCRIPTION

Figure 1:
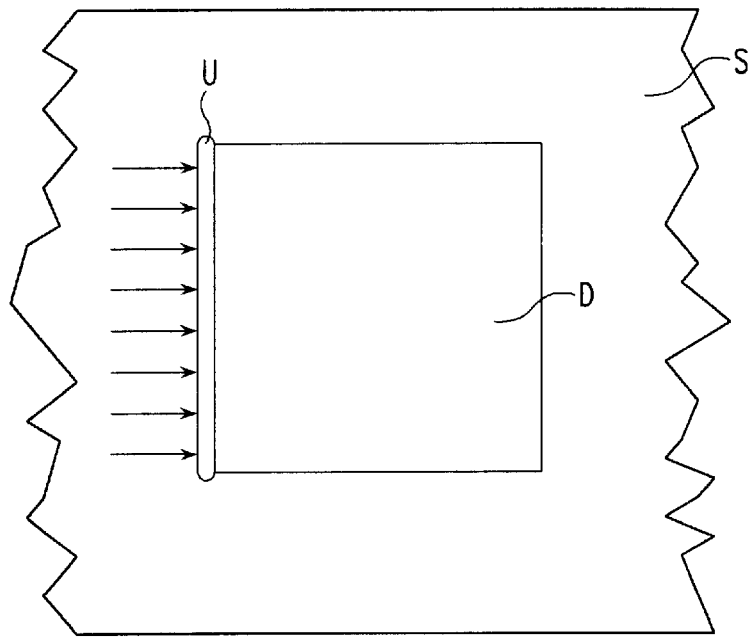
FIG. 1 is a schematic illustration of a prior art underfill process.

Various embodiments of the present invention provide microelectronic devices or methods of manufacturing microelectronic devices. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

FIGS. 3, 4, and 10–12 schematically depict the manufacture of a microelectronic device 10 in accordance with one embodiment of the invention. The microelectronic device 10 generally includes a microelectronic component 20 and a support 40. The microelectronic component 20 may be SIMM, DRAM, flash-memory, processors or any of a variety of other types of microelectronic devices. Typically, the microelectronic component 20 will be a semiconductor device of the type commonly used in flip-chip manufacture. While the microelectronic component 20 is illustrated in the drawings as being a single element, it should be understood that the microelectronic component 20 can comprise any number of subcomponents. For example, the microelectronic component 20 may comprise one or more dies attached to a common substrate, such as in a stacked-die assembly.

Figure 3:
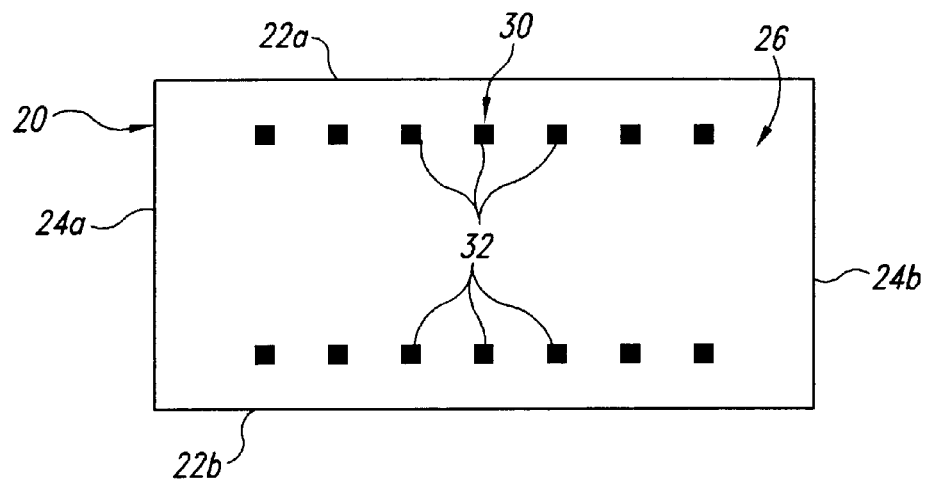
FIG. 3 is a top elevation view of a microelectronic component in accordance with an embodiment of the invention.

FIG. 3 is a top view of the microelectronic component 20. The microelectronic component includes a pair of spaced-apart lateral edges 22a and 22b and a pair of spaced-apart transverse edges 24a and 24b. The microelectronic component 20 also includes an exterior surface 28 (FIGS. 10–12) and a facing surface 26. The facing surface 26 includes a terminal array 30 comprising a plurality of terminals 32 arranged on the facing surface 26 in a predefined pattern. The terminals 32 are electrically connected to functional components of the microelectronic component 20.

Figure 4:
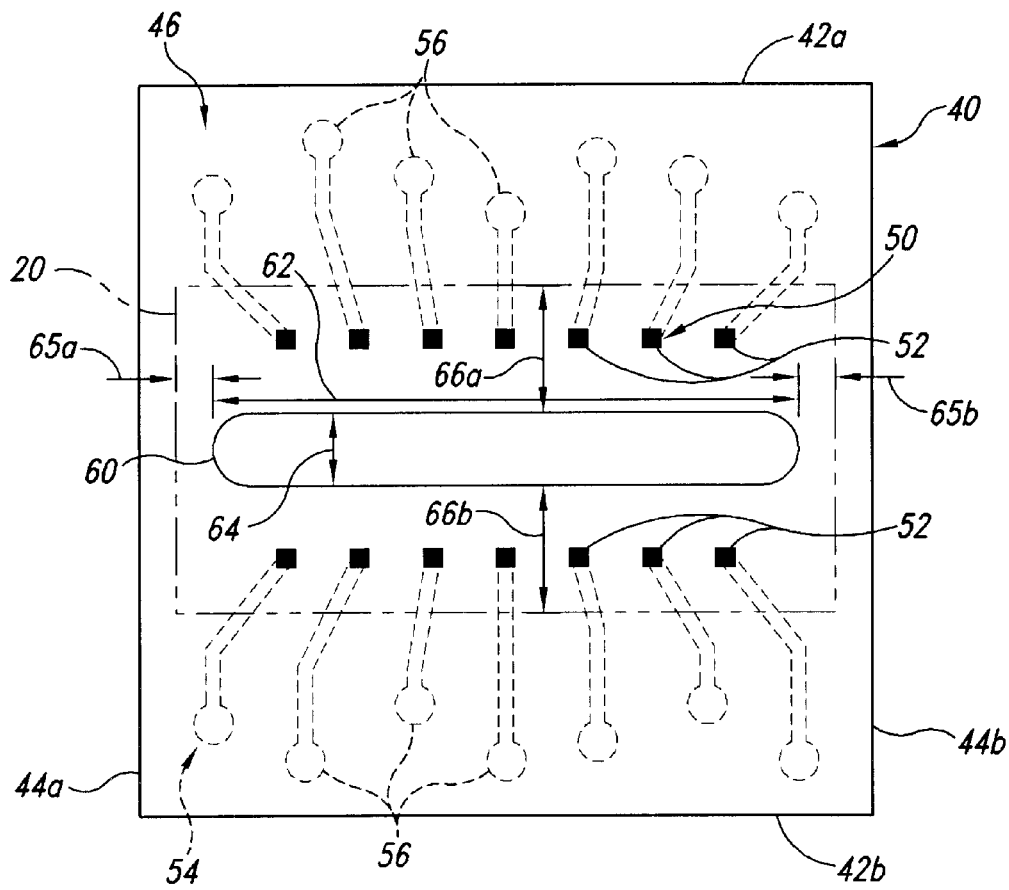
FIG. 4 is a top elevation view of a support which may be connected to the die of FIG. 3 in accordance with an embodiment of the invention.

FIG. 4 shows an embodiment of a support 40 which is adapted for use with the microelectronic component 20 shown in FIG. 3. The support 40 may be flexible or rigid and have any desired configuration. The support 40 may be formed of material commonly used to manufacture microelectronic substrates, such as ceramic, silicone, glass, or combinations thereof. The support 40 can alternatively be formed of an organic material or other materials suitable for PCBs. In one embodiment of the invention, the support 40 comprises a printed circuit board such as an FR-4 PCB. In another embodiment, the support 40 may comprise a flexible interposer such as a conventional polyimide tape (e.g., UPILEX, commercially available from Ube Industries, Inc. of Tokyo, Japan; KAPTON or MICROLUX, both commercially available from E. I. du Pont de Nemours and Co. of Delaware, USA; or ESPANEX, commercially available from Nippon Steel Chemical Co., Ltd. of Tokyo, Japan) and this microelectronic device 10 may be attached to a circuit board, as mentioned below in connection with FIGS. 15–17.

The support 40 shown in FIG. 4 includes a pair of spaced-apart lateral edges 42a and 42b and a pair of spaced-apart transverse edges 44a and 44b which together define the circumference of the substrate. In the illustrated embodiment, the support 40 is a parallelogram, with the lateral edges 42a and 42b being parallel to one another and perpendicular to both of the transverse edges 44a and 44b.

Figure 10:
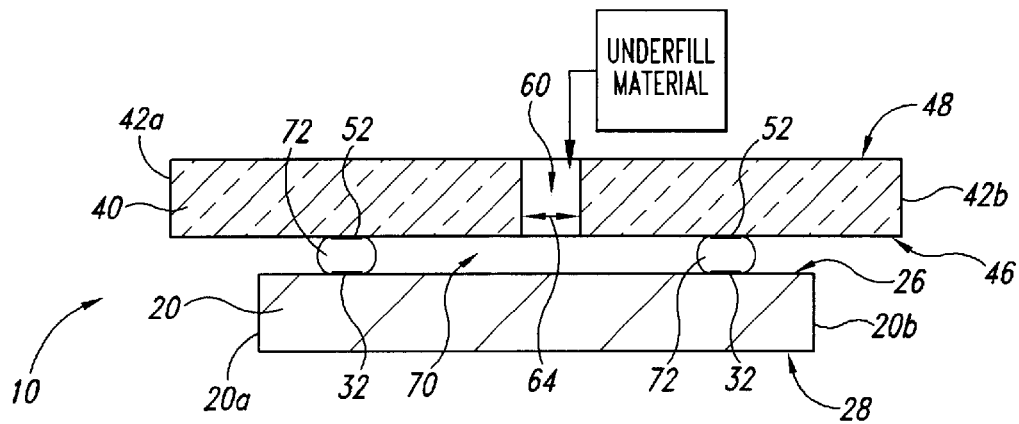
FIGS. 10–12 are side elevation views schematically illustrating a method of assembling a microelectronic device in accordance with an embodiment of the invention.
Figure 11:
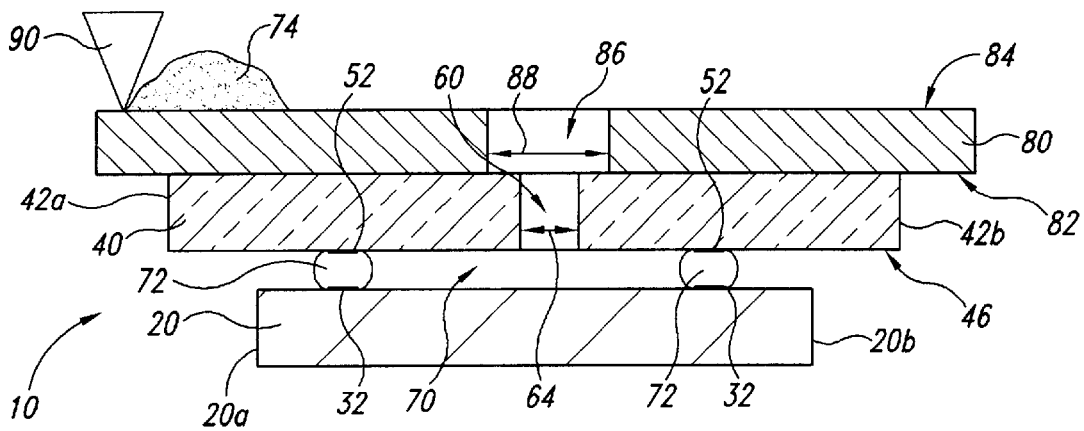
Figure 12:
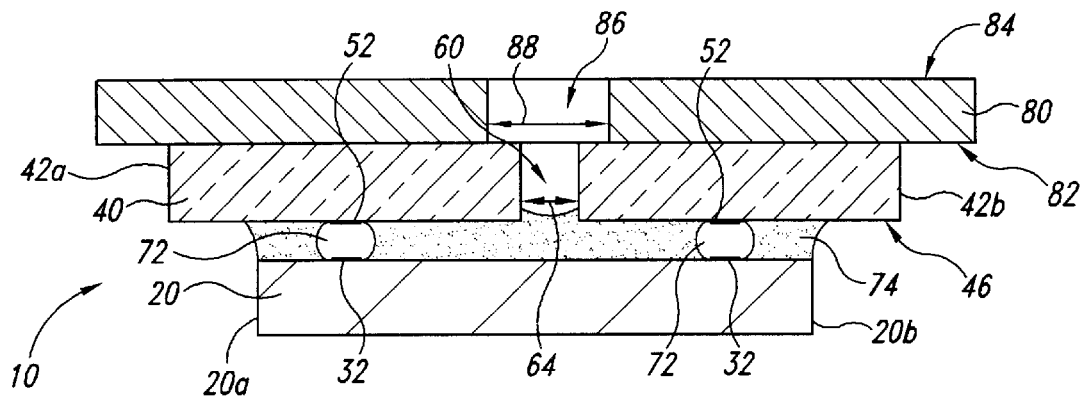

The support 40 has a component surface 46 and a mounting surface 48 (FIGS. 10–12). The component surface 46 includes a plurality of terminals 52 defining a terminal array 50. The terminals 52 on the component surface 46 are arranged in a predefined pattern which may generally correspond to the pattern of the terminals 32 of the terminal array 30 on the microelectronic component 20. The terminals 52 of the terminal array 50 may be thought of as defining a footprint of the support 40. If so desired, the terminals 52 may be electrically connected to functional components contained within or attached to the support 40. In the illustrated embodiment, each of the terminals 52 is connected to a single mounting terminal 56 carried on the mounting surface 48. These mounting terminals 56 may be arranged in a predefined pattern to define a mounting terminal array 54 on the mounting surface. This can be particularly useful where the support 40 is intended to be connected to a second support, as discussed below.

The substrate 40 also includes an underfill aperture 60 which passes through the substrate from the component surface 46 to the mounting surface 48. The underfill aperture 60 has a first dimension 62 and second dimension 64. The second dimension 64 is smaller than the first dimension 62, yielding an asymmetrical shape to the underfill aperture 60. In FIG. 4, the underfill aperture 60 is typified as an elongate slot. The first dimension 62 of the aperture 60 may coincide with a major axis of the slot. This major axis may extend along a midline which is parallel to one or both of the lateral edges 42a and 42b.

The larger first dimension 62 of the underfill aperture 64 can be adjusted for differently sized microelectronic components 20 and supports 40. It is anticipated that in most applications the first dimension will range from 3 mm to 25 mm. The smaller second dimension 64 of the underfill aperture 60 may vary depending on the size and shape of the support 40 and terminal array 50 on the component surface and the nature of the underfill material. In one embodiment of the invention, the second dimension 64 ranges from 0.03 mm to 0.5 mm. To enhance flow of underfill material 74 through the underfill aperture 60, the second dimension is desirably at least 50% greater than the largest particle size of any filler present in the underfill material. The aspect ratio of the underfill aperture 60 (i.e., the first dimension divided by the shorter second dimension) is greater than one. In one embodiment of the invention, the aspect ratio is greater than five.

In the embodiment of FIG. 4, the underfill aperture 60 is spaced farther from each of the lateral edges 42a and 42b than from either of the transverse edges 44a and 44b. The aperture 60 is shown as being generally centered on the support 40. In particular, the transverse distance from the periphery of the aperture 60 to a first lateral edge 42a is the same as the transverse distance from the other side of the aperture 60 to the other lateral edge 42b. Similarly, the lateral distance from the periphery of the aperture to a first transverse edge 44a is the same as the lateral distance from the periphery of the aperture 60 to the other transverse edge 44b. It should be understood, though, that the aperture 60 need not be centered, i.e., the aperture 60 may be positioned closer to one of the lateral edges 42a and 42b than the other and/or closer to one of the transverse edges 44a and 44b than the other.

FIG. 4 also shows (in phantom) a projection of the location of the microelectronic component 20 with respect to the support 40 in one adaptation of the invention. When the support is so positioned, the underfill aperture 60 is spaced farther from at least one of the component's lateral edges 22a and 22b than it is from one or both of the component's transverse edges 24a and 24b. In the illustrated embodiment, the transverse distance 66a from the periphery of the aperture 60 to the first lateral edge 22a of the component 20 is the same as the transverse distance 66b from the other side of the aperture 60 to the other lateral edge 22b. The lateral distances 65a and 65b from the periphery of the aperture 60 to the component's transverse edges 24a and 24b, respectively, are also equal to one another. However, the transverse distances 66a and 66b are each greater than the lateral distances 65a and 65b.

Figure 7:
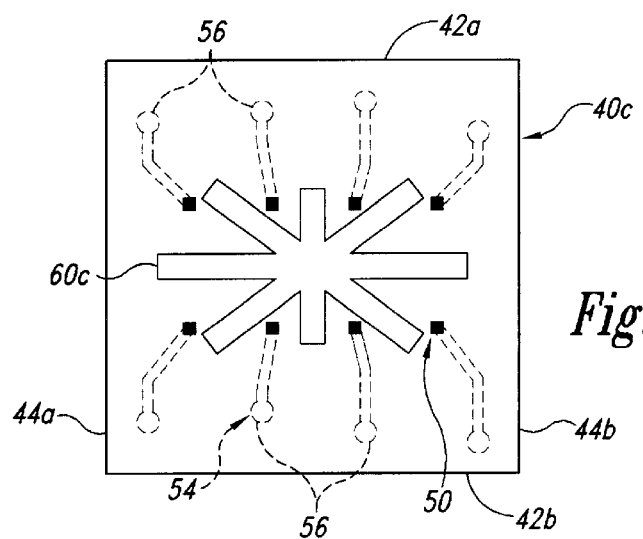
FIG. 7 is a top elevation view of a support in accordance with still another embodiment of the invention.
Figure 8:
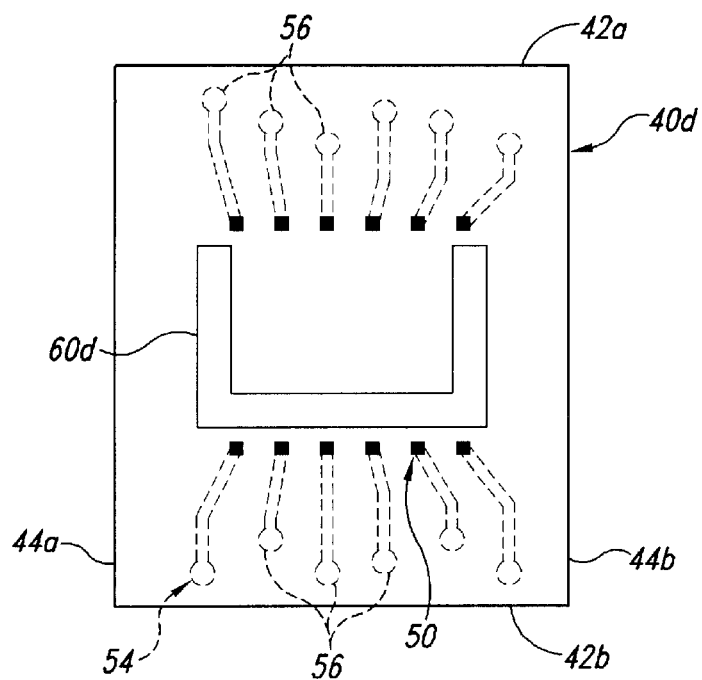
FIG. 8 is a top elevation view of a support in accordance with still another embodiment of the invention.
Figure 9:
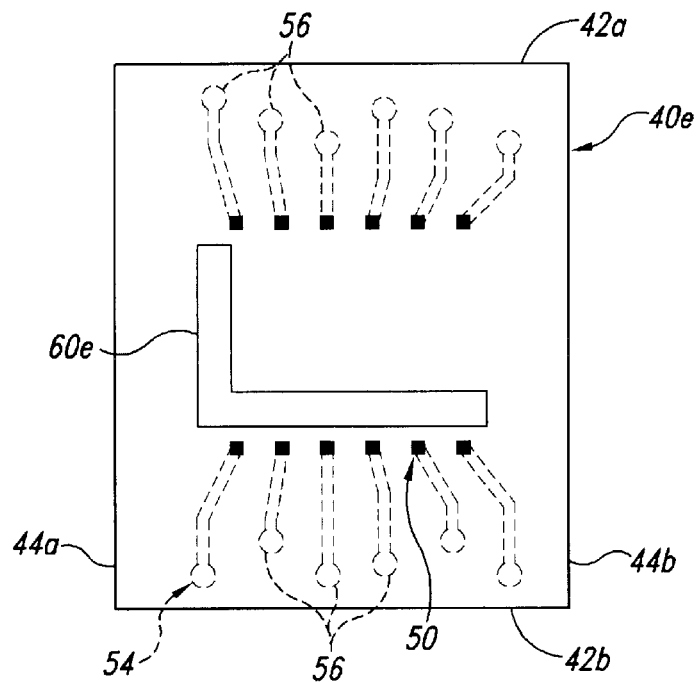
FIG. 9 is a top elevation view of a support in accordance with still another embodiment of the invention.

FIGS. 5–9 illustrate alternative underfill apertures in accordance with an embodiment of the invention. The support 40a of FIG. 5 has a generally I-shaped slot 60a. The support 40b of FIG. 6 includes a generally T-shaped slot 60b. FIG. 7 illustrates a support 40c which has a generally star-shaped underfill aperture 60c. This star-shaped aperture may be thought of as a plurality of elongate slots which intersect one another generally at the center of the support 40c to define the star-shaped aperture 60c. The support 40d of FIG. 8 has a generally U-shaped slot 60d and the support 40e of FIG. 9 has a generally L-shaped slot 60e. Both the U-shaped slot 60d and the L-shaped slot 60e are illustrated as being positioned generally within the boundaries of the terminal array 50 of the support 40. If so desired, one or more of the legs of these slots 60d and 60e may be positioned outside the area bound by the terminal array 50, e.g., between the terminal array 50 and one of the lateral edges 42. It should be understood that the embodiments of FIGS. 4–9 are merely illustrative and a wide variety of other underfill aperture shapes could also be employed.

As noted above, the present invention includes methods for manufacturing microelectronic devices. In the following discussion, reference will be made to the microelectronic component 20 and the support 40 shown in FIGS. 3 and 4. It should be understood, though, that many of the features shown in these drawings are not required for manufacturing a microelectronic device according to the methods outlined below.

Initially, the terminal array 30 of the microelectronic component 20 is electrically coupled to the terminal array 50 on the component surface 46 of the support 40. This electrical coupling may be carried out in any known fashion. For example, these components may be electrically coupled using standard flip chip manufacturing techniques such as those taught in connection with FIG. 3 of U.S. Pat. No. 5,697,148, (Lance, Jr. et al., the entire teachings of which are incorporated herein by reference).

Techniques for electrically coupling microelectronic components to supports are well known in the art and need not be discussed in great detail here. Briefly, though, a connecting material is deposited on at least one of the two terminal arrays 30 and 50 which are to be connected to one another. For example, solder "bumps" may be deposited on one or more terminals 32 of the microelectronic component's terminal array 30. The connecting material need not be solder, though. Instead, it may be any of a variety of other materials known in the art, such as gold, indium, tin, lead, silver, or alloys thereof that reflow to make electrical interconnects. The connecting material may also be formed of conductive polymeric or epoxy materials, which may be plated with metals.

The facing surface 26 of the microelectronic component 20 may be juxtaposed with the component surface 46 of the support 40, with the terminal arrays 30 and 50 generally aligned with one another. The connecting material electrically couples one or more terminals of the terminal array 30 to a corresponding terminal or terminals of the terminal array 50 on the component surface 46, as illustrated in FIG. 10. The connecting material may then be reflowed, if necessary, to electrically couple the terminals 32 and 52. The resultant electrical connector 72 may also serve to mechanically connect the microelectronic component 20 to the support 40.

FIG. 10 illustrates such a partially assembled microelectronic device 10. As can be seen in this drawing, the electrical connectors 72 serve to space the facing surface 26 of the microelectronic component 20 from the support's component surface 46. This defines a peripherally open underfill gap 70 therebetween. The electrical connectors 72 are encompassed within the underfill gap 70. The underfill gap 70 is in fluid communication with the underfill aperture 60 in the support 40. Positioning the underfill aperture 60 within the footprint of the component surface's terminal array 50 assures registry of the aperture 60 with the underfill gap 70.

In conventional manufacture, the flip chip die is positioned above the substrate during the underfill process. In accordance with one embodiment of the present invention, though, the partially assembled microelectronic device is oriented to position the support 40 above the microelectronic component 20.

The underfill gap 70 is filled by delivering an underfill material 74 (shown schematically in FIG. 10) through the underfill aperture 60 in the support 40. The underfill material 74 may be selected to enhance the mechanical bond between the microelectronic component 20 and the support 40, to help distribute stress on the microelectronic component 20 and the electrical connectors 72, and to increase structural integrity of the microelectronic device 10. The underfill material may also help protect the microelectronic component 20 and/or the electrical connectors 72 from degradation by contaminants, such as moisture.

The underfill material 74 is typically a polymeric material, such as an epoxy or acrylic resin, and may contain various types of inert fillers. These fillers may comprise, for example, silica particles. The underfill material is typically selected to have a coefficient of thermal expansion which approximates that of the microelectronic device 20 and/or the support 40 to help minimize the stress placed on the microelectronic device 10. As discussed in more detail below, the viscosity of the underfill material 74 is selected to ensure that the underfill material will flow to fill the underfill gap 70 under the selected processing conditions. In particular, the underfill material should flow easily to fill the volume of the underfill gap 70 while minimizing voids, bubbles, and non-uniform distribution of the underfill material within the underfill gap 70.

The underfill material 74 is desirably delivered to the underfill gap 70 utilizing at least a majority of the underfill aperture 60. Looking at the support 40 of FIG. 4, for example, it is desirable that the underfill material be delivered along substantially the entire first dimension 62 of the elongated slot 60. This may be accomplished in any of a variety of ways. If a dispensing nozzle is utilized, for example, the nozzle may be moved along the length of the aperture 60. Alternatively, the nozzle may have an elongated dispensing tip which extends along at least a portion of the first dimension 62 while having a width which is smaller than the second dimension 64.

FIG. 11 shows one embodiment in which the underfill material 74 is delivered to the underfill gap 70 utilizing a stencil 80. The stencil 80 includes a contact surface 82, an exterior surface 84, and a stencil aperture or opening 86. The stencil aperture 86 passes through the entire thickness of the stencil 80, extending from the contact surface 82 to the exterior surface 84. As suggested in FIG. 13 (discussed in more detail below), the shape of the stencil aperture 86 may, but need not, generally correspond to the shape of the underfill aperture 60 in the substrate 40. For example, if the underfill aperture 60 is an elongated slot, the stencil aperture 86 may also be an elongated slot. If the underfill aperture 60a is generally I-shaped, the stencil aperture 86a may be I-shaped, too. If the underfill aperture 60b is generally T-shaped, the stencil aperture 86b may also be T-shaped. If the underfill aperture 60c is generally star-shaped, the stencil opening may also be generally star-shaped. As suggested in FIG. 13, though, the stencil aperture 86c may take a different shape, such as an ellipse. If the underfill aperture 60d is generally U-shaped, the stencil aperture may be U-shaped, and if the underfill aperture 60e is generally L-shaped, the stencil aperture may be L-shaped.

In one embodiment, the stencil aperture 86 is at least as large as the underfill aperture 60 and may be larger than the underfill aperture 60. In particular, the stencil aperture 86 may have a periphery which extends outwardly beyond the periphery of the underfill aperture 60 when these two apertures are in registry with one another. For example, the width 88 of the stencil aperture 86 may be greater than the width or second dimension 64 of the underfill aperture 60. The length of the stencil aperture 86 may also be longer than the length or first dimension 62 of the underfill aperture 60.

In an alternative embodiment (not specifically illustrated), the stencil aperture 86 is no larger than, and may be smaller than, the underfill aperture 60. For example, the width 88 of the stencil aperture 86 may be smaller than the width or second dimension 64 of the underfill aperture 60 and the stencil aperture 86 may also be shorter than the first dimension 62 of the underfill aperture 60. In such an embodiment, the entire mounting surface 40 of the support adjacent the underfill aperture 60 may be covered by the stencil, reducing the volume of residue which may be left on the surface of the support 40 when the underfill process is complete.

The stencil 80 may be made of any desired material. As explained below, the stencil opening 86 can be used to control the volume of underfill material being provided to the underfill aperture 60. As a consequence, a stencil 80 in accordance with one embodiment of the invention may be flexible, but is not readily compressed or stressed under the conditions of use outlined below. Suitable stencil materials may include metals, photoimageable polyamides, dry film photo masks, liquid photoimageable photomasks, silicon, and ceramics. If so desired, the stencil 80 may be formed of a material which is not wettable by the underfill material 74.

In use, the stencil 80 is positioned above the support 40. In the illustrated embodiment, the contact surface 82 of the stencil 80 is in direct physical contact with the mounting surface 48 of the support 40. This can be achieved by providing a separate stencil 80 and positioning it directly on top of the support 40. The stencil should be positioned to ensure that the stencil aperture 86 is in registry with the underfill aperture 60. If so desired, the mounting surface 48 of the support 40 and the contact surface 82 of the stencil 80 may be provided with holes or Vernier patterns (not shown) to serve as alignment guides for aligning the stencil aperture 86 with the underfill aperture 60.

While the drawings illustrate a physically separate stencil 80, which may be reusable, it is also contemplated that the stencil 80 may be formed directly on the mounting surface 48 of the support 40, such as by using a coating of a liquid photoimageable photomask. The stencil 80 may be held in place with respect to the support 40 by tensioning the stencil 80 using a frame (not shown) that holds the edges of the stencil against the support 40.

Once the stencil 80 is properly positioned with respect to the support 40, the underfill materials 74 may be delivered to the underfill aperture 60 via the stencil aperture 86. This may be accomplished, for example, by "squeegeeing." In accordance with this embodiment, a quantity of the underfill material 74 is applied to the exterior surface 84 of the stencil 80. A squeegee blade 90 may then be dragged across the exterior surface 84, passing over the stencil aperture 86. This will deliver a predictable volume of the underfill material 74 to the stencil aperture 86.

The volume of underfill material 74 delivered through the stencil aperture will depend, in part, on the thickness of the stencil 80 and the surface area of the stencil aperture 86. The stencil aperture 86, however, is in registry with the underfill aperture 60. As a consequence, at least a portion of the underfill material 74 may pass into the underfill aperture 60 during the process of squeegeeing. The amount of underfill materials 74 which passes into the underfill aperture 60 as the blade 90 passes over the stencil aperture 86 will depend, in part, on the viscosity of the underfill material 74. For this reason, the stencil aperture 86 may only partly define the fill volume of underfill material being delivered in the squeegeeing process. The fill volume so defined should be at least as great as the volume of the underfill gap 70 to ensure that the underfill gap 70 is substantially filled with underfill material 74.

The underfill material 74 is permitted to flow through the stencil aperture 86 and the underfill aperture 60 into the underfill gap 70. The fill characteristics of the underfill material 74 may be selected to permit the fill material to substantially fill the underfill gap 70, readily flowing around the electrical connectors 72 to encapsulate and protect the connectors 72, as shown in FIG. 12. If so desired, the viscosity of the underfill material may be selected so it may fill the underfill gap without aid of hydraulic pressure, relying instead on gravity and/or capillary action, for example. In one embodiment, the viscosity of the underfill material at the temperature under which the squeegeeing takes place limits the flow of underfill material into the underfill gap 70. This facilitates delivery of a more precise volume of underfill material 74 into the central aperture 86 as the squeegee blade 90 passes over that opening. The viscosity of the underfill material may then be reduced, e.g., by heating, permitting the underfill material to flow through the underfill aperture 60 and substantially fill the underfill gap without requiring hydraulic pressure.

In another embodiment of the invention, the viscosity of the underfill material is relatively low even at room temperature. In particular, the underfill material can flow through the underfill aperture 60 and substantially fill the underfill gap 70 at room temperature without the aid of hydraulic pressure. While the control of the volume of underfill material 74 delivered to the aperture 86 may be a little less precise, a predictable volume can be delivered by consistently controlling the speed and contact pressure of the squeegee blade 90 during the squeegeeing process.

Figure 2:
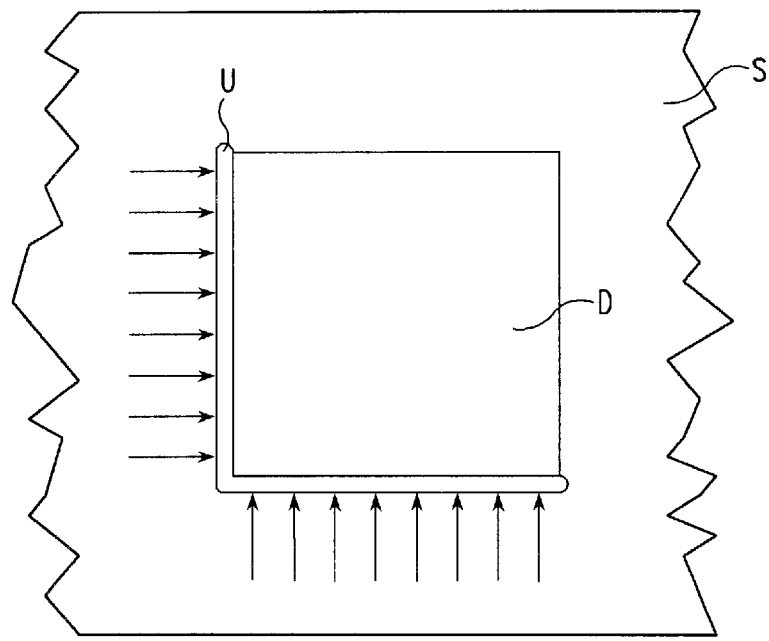
FIG. 2 is a schematic illustration of another prior art underfill process.

As noted above in connection with FIG. 4, in one embodiment of the invention, the underfill aperture 60 is spaced farther from at least one of the microelectronic component's lateral edges 22a and 22b than from at least one of the microelectronic component's transverse edges 24a and 24b. In the embodiment of FIG. 4, the transverse distances 66a and 66b from the underfill aperture 60 to lateral edges 22a and 22b, respectively, are both greater than either of the lateral distances 65a and 65b between the underfill aperture 60 and the transverse edges 24a and 24b, respectively. As a consequence, as the underfill material flows outwardly away from the underfill aperture 60 to fill the underfill gap 70, it will travel a greater distance laterally than it will travel transversely to reach the outer edge of the microelectronic component 20. The surface area of the microelectronic component 20 being covered by the underfill material will also be proportional to the distance traveled, dictating that the underfill material will cover a greater surface area laterally than it does transversely as it flows outwardly away from the underfill aperture 60. The position of the underfill aperture 60 with respect to the support 40 can appreciably reduce processing time and cost in manufacturing microelectronic devices 10 in accordance with the invention. Applying the bead of underfill material U along a single edge of the die D, as illustrated in FIG. 1 and discussed above, requires that the underfill material U flow across the entire width of the die D. Applying the underfill material U along to adjacent edges of the die D, as shown in FIG. 2, can reduce the average distance which the underfill material U must travel to completely fill the underfill gap. However, as the two fronts of the underfill material converge, they may trap air, creating voids in the underfill material. Additionally, at least some of the underfill material must travel the entire width of the die D to reach the farthest corner of the die.

Delivering the underfill material through the underfill aperture 60 reduces the distance which the underfill material has to travel to fill the underfill gap 70. For a given underfill material, this will decrease the processing time necessary to fill the underfill gap 70. Notably, surface tension will also tend to keep the underfill material 74 from flowing beyond the outer edge of the support 40. As a consequence, delivering the underfill material 74 to the underfill gap 70 via the underfill aperture 60 allows multiple microelectronic components 20 to be added to a single support without risk that capillary action will draw underfill material U intended for one die D under an adjacent component on the associated substrate S, which is a risk in the process shown in FIGS. 1 and 2.

Figure 5:
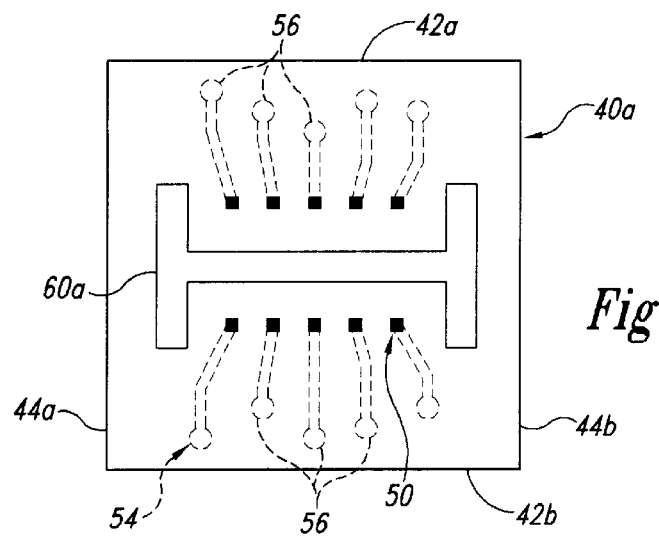
FIG. 5 is top elevation view of a support in accordance with another embodiment of the invention.
Figure 6:
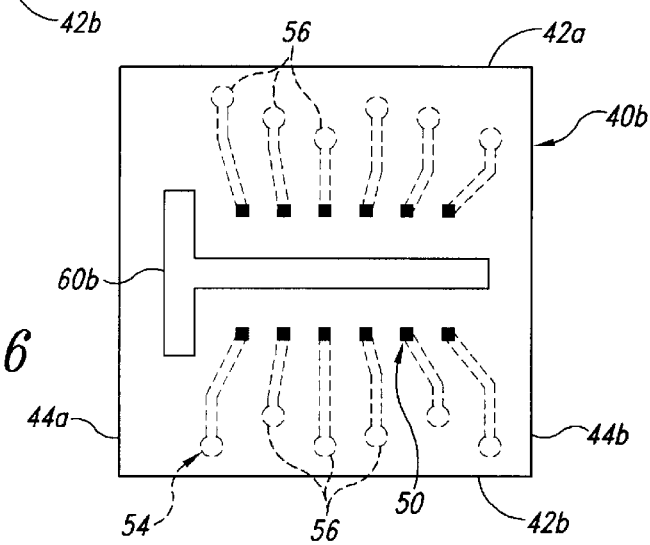
FIG. 6 is a top elevation view of a support in accordance with yet another embodiment of the invention.

Others have proposed delivering underfill material to a small, centrally located orifice through a substrate. For example, U.S. Pat. No. 5,697,148 proposes pumping an underfill material through a small hole drilled through a substrate. As can be seen in FIG. 5 of this patent, this still requires that the underfill material flow a substantial distance to completely fill the underfill gap. Using an elongate underfill aperture 60 in accordance with an embodiment of the present invention, however, can materially reduce the distance which the underflow material must travel to fill the underfill gap 70. In addition, the relatively restrictive opening through the substrate suggested in this and other patents limits the rate at which the underfill material can be delivered to the underfill gap. Hence, either it will take significantly longer to deliver the underfill material to the underfill gap or the underfill material must be delivered at an appreciably higher pressure, which can create its own difficulties. Such a restricted opening in the substrate can also make it difficult to deliver enough underfill material to fill the underfill gap using a stencil process such as that outlined above.

In comparison, the underfill aperture 60 in accordance with one embodiment of the present invention provides a materially greater surface area through which the underfill material can be delivered without unduly sacrificing useful substrate real estate which can be used to position functional elements or interconnects in the substrate beneath the microelectronic component 20. The underfill aperture 60 provides a wider passage way through which underfill material can pass, reducing the pressure needed to get the underfill material into the underfill gap in a reasonable period of time. This also facilitates delivery of the underfill material using the stencil 80 as discussed above.

Once the underfill material 74 has been delivered to the underfill aperture 60, the stencil 80 may be removed. In one embodiment, the stencil remains in place until the underfill material has flowed to fill the underfill gap. Thereafter, the stencil 80 may be removed, such as by lifting it off the mounting surface 48 of the support 40. Alternatively, the stencil may be removed by chemical etching or use of a solvent which would remove the stencil 80 from the support 40. Particularly, if a higher viscosity underfill material 74 is used and subsequently heated to fill the underfill gap 70, the stencil can be removed before the underfill material fills the underfill gap 70.

FIGS. 4–12 illustrate embodiments of the invention which utilize a single underfill aperture to fill a single underfill gap beneath a single microelectronic device. Using a stencil in accordance with an embodiment to the present invention, however, can allow the underfilling of multiple underfill gaps in a single step.

Figure 13:
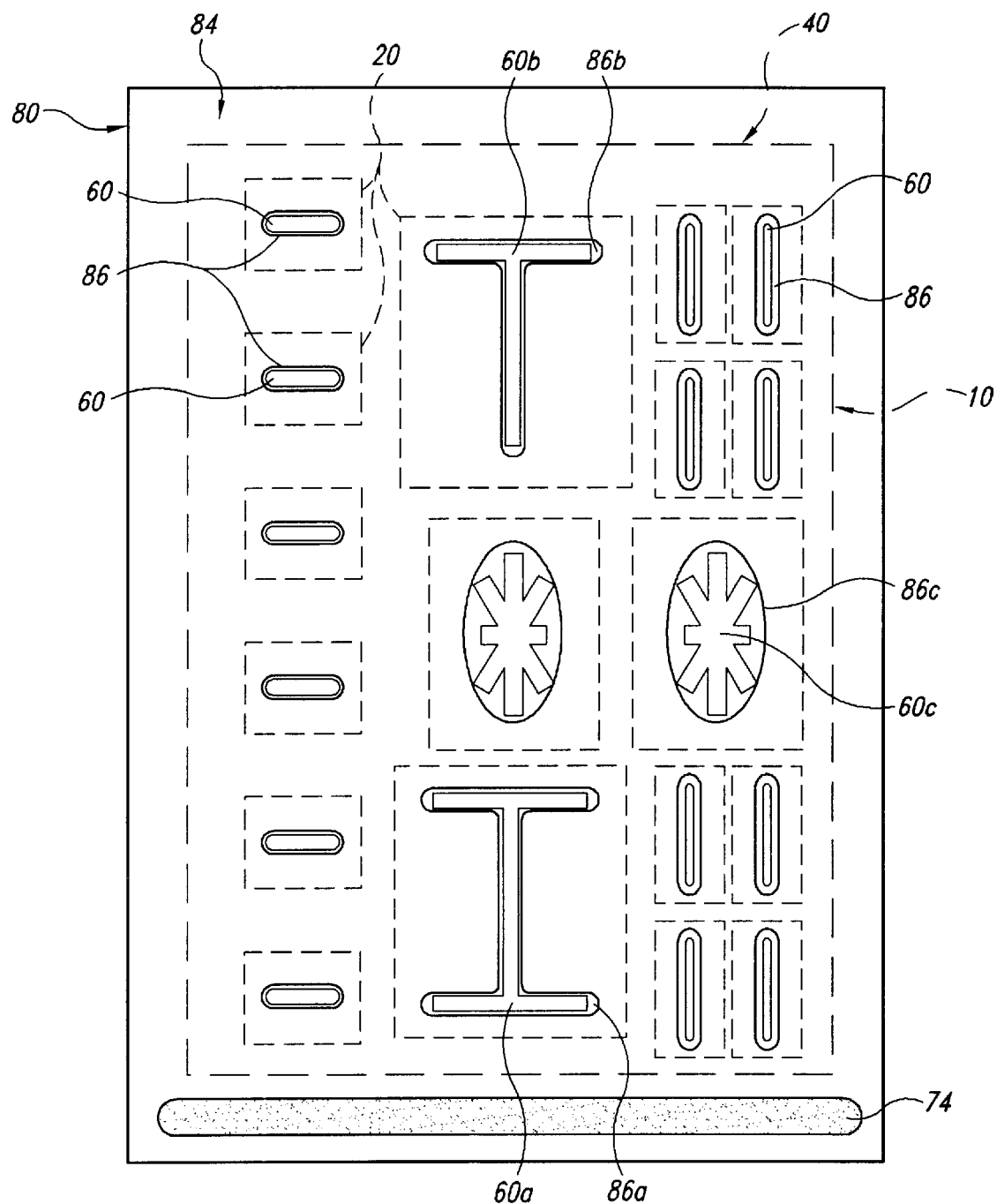
FIG. 13 is a top elevation view schematically illustrating placement of stencil to fill a plurality of underfill gaps in a single step in accordance with another alternative embodiment of the invention.

In one such embodiment of the invention, a single substrate 40 is provided with multiple microelectronic components 20, as shown in FIG. 13. The process of attaching each microelectronic component 20 the substrate may be generally as outlined above. In particular, the support 40 may be provided with multiple terminal arrays, with each terminal array being associated with one of the microelectronic components 20 to be added to the support 40. Then, for each microelectronic component 20, a connecting material can be deposited on one or both of the microelectronic component's terminal array and the associated terminal array of the support. The facing surface of each microelectronic component may then be juxtaposed with the component surface of the support such that the connecting material electrically couples the terminal array of the components with the associated terminal arrays of the support.

As schematically shown in FIG. 13, the stencil may be applied to the mounting surface 48 of the support with a separate stencil aperture 86, 86a, 86b or 86c in registry with one of the underfill apertures 60, 60a, 60b or 60c in the support 40. A single, relatively large quantity of underfill material 74 may be applied to the exterior surface 84 of the stencil 80. A squeegee blade (not shown in FIG. 13) may then be moved across the exterior surface 84 of the stencil 80, thereby filling all of the stencil apertures with underfill material in a single pass.

This can materially reduce processing time to manufacture such multi-component microelectronic devices as compared to prior art methods. For example, in the process suggested in U.S. Pat. No. 5,697,148, the needle would have to be moved from one aperture to the next, requiring relatively complex visualization equipment to ensure proper alignment of the needle. A fixed period of time is necessary to hydraulically deliver an appropriate quantity of underfill material to each underfill gap. If one were to attempt to adapt this technique to a mass manufacturing process, one may utilize multiple needles. However, this would require a dedicated needle array for each microelectronic device configuration. As the configuration of the microelectronic component change from one microelectronic device to another, the entire array of needles would have to be replaced or adjusted.

FIG. 13 illustrates a single microelectronic device 10 having a wide variety of differently sized microelectronic components 20 and a wide variety of shapes and sizes of underfill apertures 60, 60a, 60b, and 60c. This is done primarily to illustrate how various stencil aperture configurations can be positioned in relation to different underfill apertures. It should be understood that in many circumstances all of the underfill apertures and stencil apertures will be of substantially the same size and orientation.

This method allows a single substrate 40 with multiple microelectronic components 20 and multiple underfill gaps to be filled in a single pass. In a further embodiment of this method, the support 40 is subsequently divided into a plurality of separate supports, each of which carries at least one of the microelectronic components. The support may be divided either before or after removing the stencil 80. This facilitates the mass manufacture of smaller microelectronic devices by filling in the underfill gaps of multiple microelectronic devices in one simple step.

In another alternative embodiment of the invention, a plurality of partially assembled microelectronic devices are positioned adjacent to one another. The partially assembled microelectronic devices may comprise one or more microelectronic components 20 attached to a single substrate 40, such as illustrated in FIG. 10. These microelectronic device assemblies need not be positioned immediately adjacent to or abutting one another; they need only be positioned close enough to enable them to be covered using a single stencil.

To facilitate proper alignment of the stencil with the plurality of supports 40, the supports 40 are desirably aligned such that their mounting surfaces 40 are generally co-planar.

The stencil 80 may have a plurality of stencil apertures 86 and the stencil would be positioned such that at least one of the stencil apertures 86 is in registry with at least one underfill aperture 60 of each of the supports 40. All of the stencil apertures 86 may be filled with flowable underfill material in a single pass, as discussed above in connection with FIG. 13. The underfill material may be permitted to flow through each of the supports via their respective underfill apertures to fill each of the underfill gaps. Removing the stencil 80 will yield a plurality of co-formed microelectronic device assemblies 10.

Figure 14:
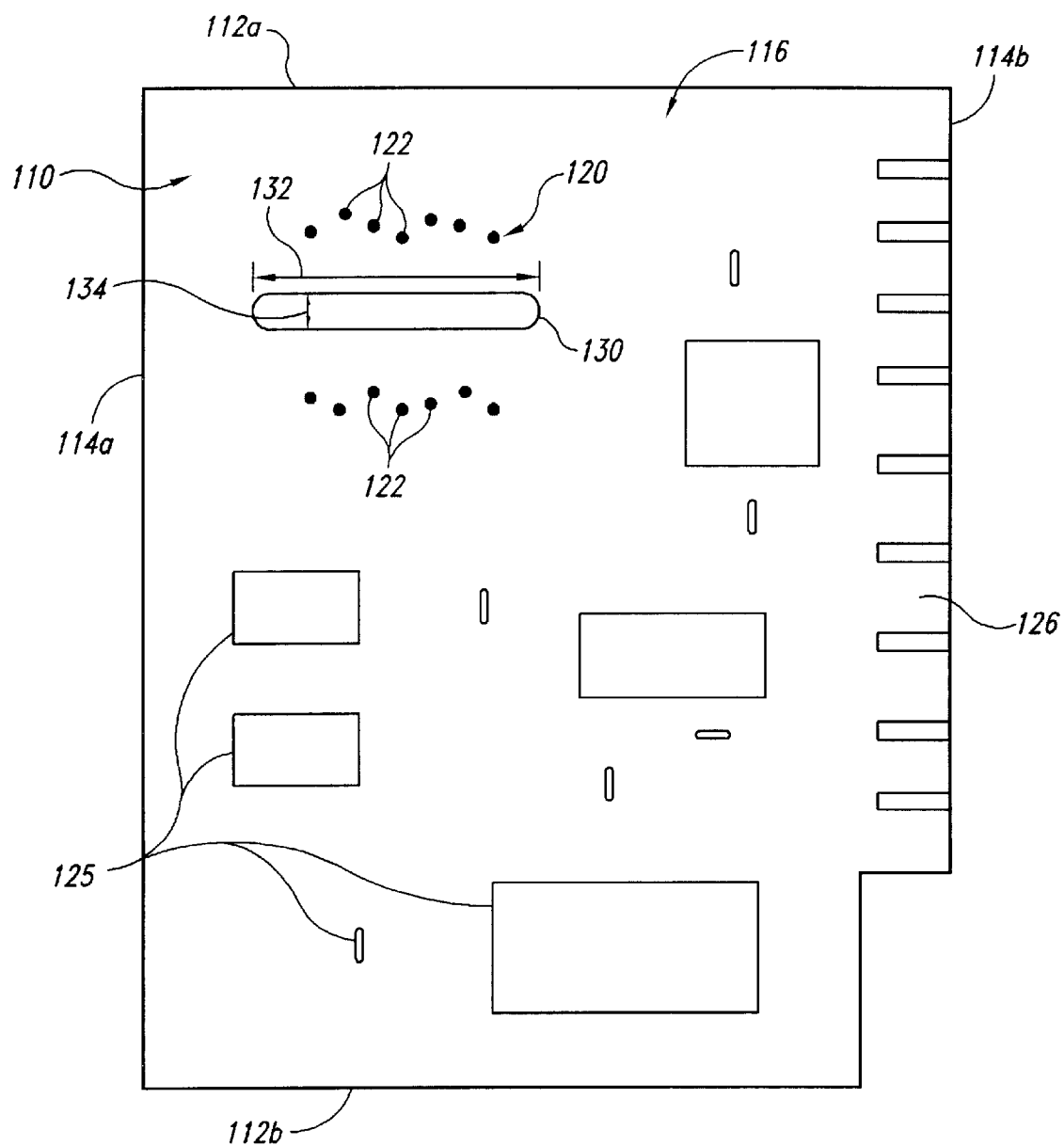
FIG. 14 is a top elevation view of a circuit board which may be coupled to the support of FIG. 4 in accordance with another embodiment of the invention.
Figure 15:
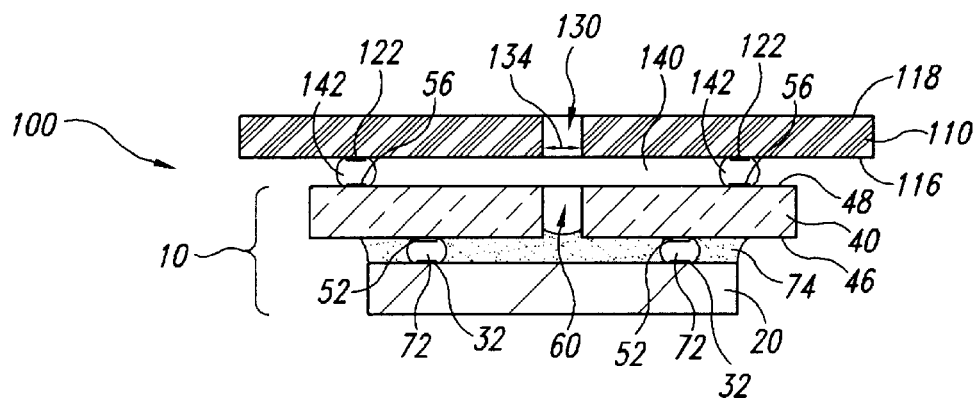
FIGS. 15–17 are side elevation views schematically illustrating a method for assembling a microelectronic device in accordance with an alternative embodiment of the invention.

FIG. 14 schematically illustrates a stylized circuit board 110 which may be used in connection with a further embodiment of the invention. This circuit board 110 has a pair of spaced-apart lateral edges 112a and 112b and a pair of spaced-apart transverse edges 114a and 114b. The circuit board 110 includes a terminal surface 116 and an outer surface 118 (FIG. 15). The terminal surface 116 bears a plurality of terminals 122 which define a terminal array 120. This terminal array 120 is configured to be electrically coupled to the terminal array 54 on the mounting surface 48 of the support 40 (shown in FIG. 4). The circuit board 110 is shown as including a plurality of additional components 125 and an interface 126 which can be used to connect the circuit board to another device. If so desired, the circuit board 110 may be a rigid PCB, though any of the materials noted above in connection with the support 40 could be used instead.

The circuit board 110 also includes a second underfill aperture 130 which extends through the thickness of the circuit board 110 from its terminal surface 116 to its outer surface 118. The second underfill aperture has a first dimension 132 and a second dimension 134 which is less than the first dimension 132. As with the underfill aperture 60 of FIG. 4, the second underfill aperture 130 in FIG. 14 is typified as an elongated slot. It should be understood, though, that this second underfill aperture 130 may take on a variety of different shapes, e.g., shapes analogous to the underfill apertures shown in FIGS. 5–9.

Figure 16:
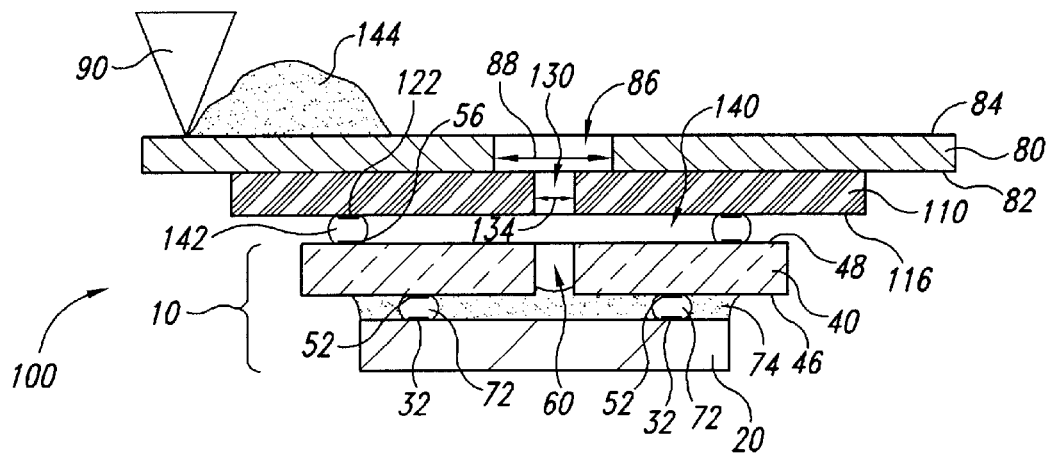
Figure 17:
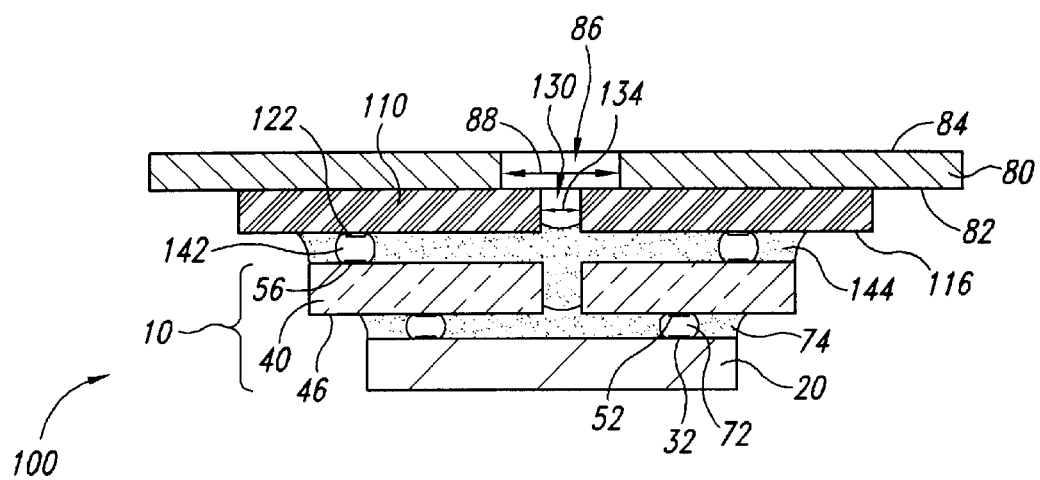

FIGS. 15–17 schematically illustrate a method of one embodiment to the invention for assembling a microelectronic device 10 such as that discussed above with a circuit board 110 or other second support. This yields a larger microelectronic device 100 in which the microelectronic device 10 discussed above may be considered a subassembly. The process illustrated in FIGS. 15–17 is directly analogous to the process outlined above in connection with FIGS. 10–12. In particular, the terminal array 120 of the circuit board 110 will be electrically coupled to the terminal array 54 on the support's mounting surface 48 via electrical connectors 142. This will define a second underfill gap 140 between the circuit board 110 and the support 140. In FIGS. 15–17, the second underfill aperture 130 is shown as being about the same size and positioned vertically directly above the first underfill aperture 60. It should be understood, however, that this is not necessary and the two underfill apertures 60, 130 can be different sizes and positioned in different locations or orientations with respect to one another.

The second underfill gap 140 may be filled with a second underfill material 144 in any desired fashion. For example, it may be filled using a stencil 80 and squeegee blade 90 generally outlined above in connection with FIGS. 10–12. Desirably, the second underfill material not only fills the gap between the second support's terminal surface 116 and the other support's mounting surface 148, but also fills any remaining void in the underfill aperture 60 in the support 40. This can be facilitated by positioning the second underfill aperture 130 directly above the first underfill aperture 60.

The second underfill material 144 may be different from the underfill material 74. This may be advantageous if different design objectives are required of the second underfill material 144. In one embodiment of the invention, however, both of the underfill materials 74 and 144 have the same composition.

The process outlined in FIGS. 15–17 start with a microelectronic device 10 wherein the underfill gap 70 is already filled with underfill material 74 before the microelectronic device 10 is attached to the second support 110. Thereafter, the second underfill gap 140 is filled with the second underfill material 144 is a separate step. In an alternative embodiment, the first underfill gap 70 and the second underfill gap 140 are filled with a common underfill material in a single step. In accordance with this embodiment, the underfill aperture 60 in the first support 40 is in fluid communication with the second underfill gap 140. As shown in FIGS. 15–17, the second underfill aperture 130 may be positioned directly above the first underfill aperture 60. The first and second underfill gaps 70 and 140 may then be filled with a common underfill material 74 in a single step, e.g., using a stencil 80 and squeegee blade 90 analogous to that discussed above in the context of FIGS. 10–12.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method of assembling the microelectronic device assembly that includes:

a microelectronic component having a facing surface that carries a first terminal array;

a first support having a component surface, a second terminal array carried on the component surface and electrically coupled to the first terminal array, and an elongate aperture extending through a thickness of the support and having a first dimension and a second dimension less than the first dimension, the component surface of the support being juxtaposed with the facing surface of the microelectronic component to define an underfill gap between the component surface and the facing surface; and an underfill material substantially filling the underfill gap;

the method comprising:

juxtaposing the facing surface with the component surface and electrically coupling terminals of the first terminal array with terminals of the second terminal array, the facing surface and the component surface being spaced from one another to define the first underfill gap;

placing a stencil adjacent the exterior surface of the support, the stencil having a stencil opening in registry with the elongate aperture through the support, thereby defining an outwardly-open volume for receiving underfill material;

filling the outwardly-open volume with the first underfill material;

allowing the first underfill material to flow into and substantially fill the first underfill gap; and removing the stencil.

2. A method of underfilling a microelectronic component electrically coupled to a support, the microelectronic component and the support defining an underfill gap therebetween, an underfill aperture extending through the support and in fluid communication with the underfill gap, the method comprising:

placing a stencil adjacent the underfill aperture, the stencil having a stencil opening in registry with the underfill aperture, the stencil opening defining, with the underfill aperture, a reproducible fill volume at least as great as a volume of the underfill gap;

filling the fill volume with a flowable underfill material at a first viscosity;

reducing the viscosity of the underfill material, thus permitting the underfill material in the stencil opening to flow through the support via the underfill aperture to a level within the underfill aperture to leave a void in the underfill aperture, the underfill material substantially filling the underfill gap; and removing the stencil.

3. The method of claim 2 wherein a plurality of microelectronic components are electrically coupled to the support, each microelectronic component being spaced from the support to define a separate underfill gap for each microelectronic component, a separate underfill aperture being provided for each underfill gap, and the stencil having a separate stencil opening for registry with each underfill aperture, the method further comprising:

placing the stencil adjacent an exterior surface of the support such that one of the stencil openings is in registry with each underfill aperture;

filling all of the stencil openings with a flowable underfill material in a single pass;

permitting the underfill material to flow through the support via the underfill apertures and substantially fill each of the underfill gaps; and removing the stencil.

4. The method of claim 2 further comprising, after removing the stencil and after the underfill material substantially fills the underfill gap:

providing a circuit board having an underfill aperture therethrough and a terminal array on a terminal surface thereof;

juxtaposing a mounting surface of the support with the terminal surface of the circuit board;

electrically coupling a terminal array on the mounting surface of the support to the terminal array on the terminal surface of the circuit board, the mounting surface and the terminal surface defining a second underfill gap therebetween; and thereafter, substantially filling the second underfill gap with a second underfill material through the underfill aperture in the circuit board.

5. The method of claim 2 wherein the underfill material is selected to have a viscosity at room temperature which permits it to flow through the underfill aperture and substantially fill the first underfill gap without aid of hydraulic pressure.

6. The method of claim 2 wherein the underfill material is heated to permit it to flow through the underfill aperture and substantially fill the first underfill gap without aid of hydraulic pressure.

7. The method of claim 2 wherein the stencil is positioned above the support and the support is positioned above the microelectronic component, the underfill material being permitted to flow through the underfill aperture and substantially fill the first underfill gap under gravity and capillary action without aid of hydraulic pressure.

8. The method of claim 2 wherein the underfill aperture comprises an elongate underfill slot and the stencil opening comprises a stencil slot having a width greater than a width of the elongate underfill slot, the stencil being positioned to extend outwardly beyond a periphery of the elongate underfill slot.

9. The method of claim 2 wherein the underfill aperture comprises an I-shaped underfill slot having a periphery and the stencil opening comprises an I-shaped stencil slot having a periphery, the stencil being positioned such that the periphery of the stencil slot extends outwardly beyond the periphery of the underfill slot.

10. The method of claim 2 wherein the underfill aperture comprises a T-shaped underfill slot having a periphery and the stencil opening comprises a T-shaped stencil slot having a periphery, the stencil being positioned such that the periphery of the stencil slot extends outwardly beyond the periphery of the underfill slot.

11. The method of claim 2 wherein the underfill aperture comprises a star-shaped underfill opening having a periphery and the stencil opening has a periphery, the stencil being positioned such that the periphery of the stencil opening extends outwardly beyond the periphery of the underfill opening.

12. The method of claim 2 wherein the underfill aperture comprises a U-shaped underfill slot having a periphery and the stencil opening comprises a U-shaped stencil slot having a periphery, the stencil being positioned such that the periphery of the stencil slot extends outwardly beyond the periphery of the underfill slot.

13. The method of claim 2 wherein the underfill aperture comprises an L-shaped underfill slot having a periphery and the stencil opening comprises an L-shaped stencil slot having a periphery, the stencil being positioned such that the periphery of the stencil slot extends outwardly beyond the periphery of the underfill slot.

14. A method of manufacturing a microelectronic device assembly including a microelectronic component and a first support, the microelectronic component having a facing surface carrying a first terminal array, the first support having a component surface carrying a second terminal array defining a footprint, a mounting surface, and an elongate underfill slot having closed ends extending through the first support from its component surface to its mounting surface at a location within the footprint, the method comprising:

juxtaposing the facing surface of the microelectronic component with the component surface of the first support and electrically coupling terminals of the first terminal array with terminals of the second terminal array, the facing surface and the component surface being spaced from one another to define a first underfill gap therebetween;

placing a stencil adjacent the elongate underfill slot such that a stencil slot in the stencil is in registry with the elongate underfill slot, the stencil slot defining, with the underfill aperture, a reproducible fill volume at least as great as a volume of the underfill gap;

filling the fill volume with a flowable underfill material;

permitting the underfill material in the stencil opening to flow through the elongate underfill slot and laterally outwardly therefrom to a level within the underfill aperture to leave a void in the underfill aperture, the underfill material substantially filling the first underfill gap; and removing the stencil.

15. The method of claim 14 wherein the microelectronic device assembly includes a plurality of microelectronic components, each microelectronic component including a facing surface carrying a first terminal array; the first support includes a plurality of second terminal arrays, each of which defines a separate footprint, and a separate elongate underfill slot within each footprint; and the stencil has a plurality of stencil slots; the method further comprising:

for each microelectronic component, depositing a connecting material on at least one of the first terminal array of the microelectronic component and an associated one of the second terminal arrays;

for each microelectronic component, juxtaposing the facing surface of the microelectronic component with the mating surface of the first support such that the connecting material electrically couples terminals of the first terminal array of the microelectronic component with terminals of the associated second terminal array, the facing surface of each microelectronic component being spaced from the mating surface to define a separate underfill gap between each microelectronic component and the support;

placing the stencil adjacent an exterior surface of the support such that one of the stencil openings is in registry with each elongate underfill slot;

filling all of the stencil openings with a flowable underfill material in a single pass; and permitting the underfill material to flow through the support via the underfill slots and substantially fill each of the underfill gaps.

16. The method of claim 14 wherein the underfill material is selected to have a viscosity at room temperature which permits it to flow through each of the underfill apertures and substantially fill each of the underfill gaps without aid of hydraulic pressure.

17. The method of claim 14 wherein the underfill material is heated to permit it to flow through each of the underfill apertures and substantially fill the underfill gaps without aid of hydraulic pressure.

18. The method of claim 14 wherein the stencil is positioned above the partially assembled microelectronic device assemblies and each of the partially assembled microelectronic device assemblies is oriented such that its support is above its microelectronic component, the underfill material being permitted to flow through each of the underfill apertures and substantially fill each of the underfill gaps without aid of hydraulic pressure.

19. The method of claim 14 wherein the stencil slot has a width greater than a width of the elongate underfill slot, the stencil being positioned to extend outwardly beyond a periphery of the elongate underfill slot.

20. The method of claim 14 wherein the elongate underfill slot is I-shaped and has a periphery and the stencil slot is I-shaped and has a periphery, the stencil being positioned such that the periphery of the stencil slot extends outwardly beyond the periphery of the elongate underfill slot.

21. The method of claim 14 wherein the elongate underfill slot is T-shaped and has a periphery and the stencil slot is T-shaped and has a periphery, the stencil being positioned such that the periphery of the stencil slot extends outwardly beyond the periphery of the elongate underfill slot.

22. The method of claim 14 wherein a plurality of elongate underfill slots are provided through the first support, the elongate underfill slots intersecting one another to form a star-shaped underfill aperture having a periphery and the stencil slot has a periphery, the stencil being positioned such that the periphery of the stencil slot extends outwardly beyond the periphery of the underfill aperture.

23. The method of claim 14 wherein the elongate underfill slot is U-shaped and has a periphery and the stencil slot is U-shaped and has a periphery, the stencil being positioned such that the periphery of the stencil slot extends outwardly beyond the periphery of the elongate underfill slot.

24. The method of claim 14 wherein the elongate underfill slot is L-shaped and has a periphery and the stencil slot is L-shaped and has a periphery, the stencil being positioned such that the periphery of the stencil slot extends outwardly beyond the periphery of the elongate underfill slot.

25. The method of claim 14 further comprising, after removing the stencil and after the underfill material substantially fills the first underfill gap:

providing a second support having an underfill aperture therethrough and a terminal array on a terminal surface thereof;

juxtaposing the mounting surface of the first support with the terminal surface of the second support;

electrically coupling a terminal array on the mounting surface to the terminal array of the second support, the mounting surface and the terminal surface defining a second underfill gap therebetween;

thereafter, substantially filling the second underfill gap with a second underfill material through the underfill aperture in the second support.

26. A method of underfilling a plurality of assemblies, comprising:

positioning a plurality of partially assembled microelectronic device assemblies adjacent one another, each partially assembled microelectronic device assembly including a microelectronic component attached to and electrically coupled with a separate support, an underfill gap defined between the microelectronic component and the support, and an underfill aperture passing through the support and in fluid communication with the underfill gap;

providing a stencil having a plurality of stencil apertures therethrough;

positioning the stencil adjacent the plurality of adjacent partially assembled microelectronic assemblies such that one of the stencil apertures is in registry with each of the underfill apertures;

filling all of the stencil apertures with a flowable underfill material in a single pass;

permitting the underfill material to flow through each of the supports via the underfill aperture therein and substantially fill each of the underfill gaps; and removing the stencil, yielding a plurality of co-formed microelectronic device assemblies.

27. A method of manufacturing a microelectronic device assembly including a support and a plurality of microelectronic components, each microelectronic component having a facing surface carrying a terminal array, the support having a mounting surface, a component surface carrying a plurality of terminal arrays, and a plurality of underfill apertures, the method comprising:

for each microelectronic component, depositing a connecting material on at least one of the terminal array of the microelectronic component and an associated one of the terminal arrays of the support;

for each microelectronic component, juxtaposing the facing surface of the microelectronic component with the component surface of the support such that the connecting material electrically couples a terminal array of the microelectronic component with one of the terminal arrays of the support, the facing surfaces of each microelectronic component being spaced from the component surface of the support to define a separate underfill gap between each microelectronic component and the support, at least one of the underfill apertures being in fluid communication with each underfill gap;

placing a stencil adjacent the mounting surface of the support, the stencil having a separate stencil aperture in registry with each of the underfill apertures in the support, each stencil aperture defining, at least in part, a fill volume at least as great as a volume of the underfill gap in fluid communication with the underfill aperture with which the stencil aperture is registered;

filling all of the stencil apertures with a flowable underfill material in a single pass;

permitting the underfill material to flow through the support via the underfill apertures and laterally outwardly therefrom to substantially fill each of the underfill gaps; and removing the stencil.

28. The method of claim 27 wherein the underfill material is selected to have a viscosity at room temperature which permits it to flow through the underfill apertures and substantially fill the underfill gaps without aid of hydraulic pressure.

29. The method of claim 27 wherein the underfill material is heated to permit it to flow through the underfill apertures and substantially fill the underfill gaps without aid of hydraulic pressure.

30. The method of claim 27 wherein the stencil is positioned above the support and the support is positioned above the microelectronic components, the underfill material being permitted to flow through the underfill apertures and substantially fill the underfill gaps without aid of hydraulic pressure.

31. The method of claim 27 wherein each stencil slot has a width greater than a width of the underfill aperture with which it is registered, the stencil being positioned so that each stencil slot extends outwardly beyond a periphery of the underfill aperture with which it is registered.

32. The method of claim 27 wherein at least one of the underfill apertures is I-shaped and has a periphery and the stencil aperture which is registered therewith is I-shaped and has a periphery, the stencil being positioned such that the periphery of the I-shaped stencil aperture extends outwardly beyond the periphery of the I-shaped underfill aperture.

33. The method of claim 27 wherein at least one of the underfill apertures is T-shaped and has a periphery and the stencil aperture which is registered therewith is T-shaped and has a periphery, the stencil being positioned such that the periphery of the T-shaped stencil aperture extends outwardly beyond the periphery of the T-shaped underfill aperture.

34. The method of claim 27 wherein at least one of the underfill apertures has a star-shaped periphery, the stencil aperture which is registered therewith having a periphery, the stencil being positioned such that the periphery of the stencil aperture extends outwardly beyond the star-shaped periphery of the underfill aperture.

35. The method of claim 27 wherein at least one of the underfill apertures is U-shaped and has a periphery and the stencil aperture which is registered therewith is U-shaped and has a periphery, the stencil being positioned such that the periphery of the U-shaped stencil aperture extends outwardly beyond the periphery of the U-shaped underfill aperture.

36. The method of claim 27 wherein at least one of the underfill apertures is L-shaped and has a periphery and the stencil aperture which is registered therewith is L-shaped and has a periphery, the stencil being positioned such that the periphery of the L-shaped stencil aperture extends outwardly beyond the periphery of the L-shaped underfill aperture.

37. The method of claim 27 further comprising, after removing the stencil, dividing the support into a plurality of supports, each of which carries at least one of the microelectronic components.

38. The method of claim 27 further comprising, after removing the stencil and after the underfill material substantially fills each of the underfill gaps:

providing a circuit board having an underfill aperture therethrough and a terminal array on a terminal surface thereof;

juxtaposing the mounting surface of the support with the terminal surface of the circuit board;

electrically coupling a terminal array on the mounting surface to the terminal array on the terminal surface, the mounting surface and the terminal surface defining a second underfill gap therebetween; and thereafter, substantially filling the second underfill gap with a second underfill material through the underfill aperture in the circuit board.

39. The method of claim 27 wherein the stencil apertures are filled by delivering a quantity of the underfill material to an exterior surface of the stencil and moving a blade across the stencil apertures.

40. A method of underfilling a microelectronic component electrically coupled to a support, the microelectronic component and the support defining an underfill gap therebetween, the method comprising:

placing a removable stencil in contact with an exterior surface of the support, the stencil having a stencil opening in registry with an underfill aperture in the support, the underfill aperture having a first dimension and a second dimension less than the first dimension;

filling the stencil opening and at least a portion of the underfill aperture with an underfill material;

allowing the underfill material to flow through and outwardly from the underfill aperture to substantially fill the underfill gap; and removing the removable stencil.

41. The method of claim 40 wherein the microelectronic component has a pair of spaced-apart lateral edges and a pair of spaced-apart transverse edges, the underfill aperture being spaced farther from each of the lateral edges than from either of the transverse edges, the underfill material flowing outwardly from the underfill aperture a greater distance, and covering a greater surface area, laterally than transversely.

42. The method of claim 40 wherein the underfill material is selected to have a viscosity at room temperature which permits it to flow through the underfill aperture and substantially fill the first underfill gap without aid of hydraulic pressure.

43. The method of claim 40 wherein the underfill material is heated to permit it to flow through the underfill aperture and substantially fill the first underfill gap under capillary action without aid of hydraulic pressure.

* * * * *